(12) United States Patent
Smola et al.

(10) Patent No.: US 6,452,283 B2
(45) Date of Patent: Sep. 17, 2002

(54) SEMICONDUCTOR CHIP WITH SURFACE COVER

(75) Inventors: Michael Smola; Eric-Roger Brücklmeier, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/789,990

(22) Filed: Feb. 20, 2001

Related U.S. Application Data

(63) Continuation of application No. PCT/EP99/06077, filed on Aug. 18, 1999.

(30) Foreign Application Priority Data

Aug. 18, 1998 (EP) .............................................. 98115550

(51) Int. Cl.$^7$ ................................................ H01L 23/48
(52) U.S. Cl. ........................ 257/784; 257/297; 257/306; 257/310; 365/228
(58) Field of Search ............................... 365/52, 185.15, 365/218, 228; 257/336, 398, 297, 306, 310; 174/52.4; 438/264, 535, 672

(56) References Cited

U.S. PATENT DOCUMENTS

| | | | | |
|---|---|---|---|---|
| 4,593,384 A | * | 6/1986 | Kleijne | ....................... 365/228 |
| 5,389,738 A | * | 2/1995 | Piosenka et al. | ........... 174/52.4 |
| 6,330,187 B1 | * | 12/2001 | Choi et al. | ............. 365/185.15 |

FOREIGN PATENT DOCUMENTS

| | | |
|---|---|---|
| DE | 40 18 688 A1 | 1/1991 |
| DE | 196 39 033 C1 | 8/1997 |
| EP | 0 169 941 A1 | 2/1986 |
| EP | 0 300 864 A2 | 1/1989 |
| EP | 0 378 306 A2 | 7/1990 |
| EP | 0 510 434 A2 | 10/1992 |
| EP | 0 771 030 A1 | 5/1997 |
| GB | 2 288 048 A | 10/1995 |

* cited by examiner

Primary Examiner—Hoai Ho
Assistant Examiner—Mai-Huong Tran
(74) Attorney, Agent, or Firm—Laurence A. Greenberg; Werner H. Stemer; Ralph E. Locher

(57) ABSTRACT

A semiconductor chip having circuits which are produced in at least one layer of a semiconductor substrate and are arranged in at least one group. The semiconductor chip has at least one conductive protective layer which is arranged above at least one such circuit group and is electrically connected to at least one of the circuits. The substrate has at least one protective sensor, and the detection connection(s) of the protective sensor/protective sensors is/are connected to the conductive protective layer or to at least one of the conductive protective layers. Output connections of the protective sensor/protective sensors are connected to at least one of the circuits such that the circuit(s) cannot operate properly if there is a defined, nonvolatile level at the output of the protective sensor(s).

6 Claims, 3 Drawing Sheets

SEMICONDUCTOR CHIP WITH SURFACE COVER

CROSS-REFERENCE TO RELATED APPLICATION

This application is a continuation of copending International Application No. PCT/EP99/06077, filed Aug. 18, 1999, which designated the United States.

BACKGROUND OF THE INVENTION

Field of the Invention

The invention relates to a semiconductor chip having circuits which are produced in at least one layer of a semiconductor substrate and are arranged in at least one group, and having at least one conductive protective layer which is arranged above at least one such circuit group and is electrically connected to at least one of the circuits.

Such a semiconductor chip is known from EP 0 378 306 A2. In the semiconductor chip in this publication, a first circuit group is arranged in a protected region and a second circuit group is arranged in an unprotected region. In the known semiconductor chip, the first region is protected by a conductive layer which is arranged above the wiring plane of the first circuit group. This conductive layer is electrically connected to the circuit group, and this circuit group operates properly only when the layer is intact.

In this case, the first circuit group includes a microprocessor and also associated peripheral circuits, such as memories and a transfer logic circuit. The memories may contain, in particular, secret information. It is also conceivable for the microprocessor to have a special structure which is particularly well suited to security-relevant functions. The conductive layer, whose intactness is constantly checked, prevents covert observation using a scanning electron microscope, for example, during operation of the circuit.

However, it is still possible to remove the protective layer and create replacement lines which are not situated above security-critical regions. In this way, the circuits can still be examined during operation, albeit only under very complex circumstances at present.

EP 0 169 941 A1 also shows a semiconductor circuit, having a passivation layer which is in the form of an equipotential surface and shields circuit parts situated beneath it. This passivation layer is incorporated into security logic as an active conductor track, so that removing it interrupts operation of the chip and makes dynamic analysis impossible.

However, if a kind of bypass line (which, even though it performs the line function of the passivation layer, does not perform the shielding function) is successfully fitted instead of the covering passivation layer, the semiconductor circuit is activated again in this known protective circuit.

EP 0 300 864 A2 discloses the practice of providing a conductive protective layer including two part-layers whose capacitance is evaluated. Although this does not make it a simple matter to replace one or both part-layers with other conductive structures, simulating the capacitance using other structures which expose at least parts of the circuit would bypass the security precaution. In any case, removing the layers and subsequently replacing them, for the purposes of making at least a static inspection of the semiconductor chip, cannot be detected later.

One method of removing layers and also of adding new layers, such as bypass lines, is the focused ion beam (FIB) method. Although this was developed primarily for eliminating errors and restructuring, it presents a considerable risk for security-critical semiconductor chips.

SUMMARY OF THE INVENTION

It is accordingly an object of the invention to provide a semiconductor chip which overcomes the above-mentioned disadvantageous of the prior art apparatus of this general type, and which, in particular, is safe from FIB attacks. With the foregoing and other objects in view there is provided, in accordance with the invention a substrate of a semiconductor chip which has at least one protective sensor which is formed such that it is able to store a state in nonvolatile fashion. The detection connection of the protective sensor is connected to the conductive protective layer or to at least one of a plurality of conductive protective layers. The output connection of the protective sensor is connected to at least one of the circuits on the substrate such that the circuit cannot operate properly if there is a defined, nonvolatile level at the output connection of the protective sensor.

In accordance with an added feature of the invention, the protective sensor may advantageously be a transistor which has a very thin gate oxide as compared with transistors in the circuits. Alternatively, other components acting as fuses may be used, such as diodes. The important thing for a component intended to operate as a protective sensor is that a voltage can modify it in nonvolatile fashion.

In this context, nonvolatile means that not only is a stored state maintained after the supply voltage has been turned off and applied again, but also that removing and reapplying a conductive layer which produces a connection is detected and recorded. Thus, even if the layer is intact, it is possible to establish whether it has been removed previously or whether an attempt to do so has been made.

This is because it has been found that the structures treated using the FIB method become electrically charged. The voltage produced as a result of this is detected by the protective sensors and is evaluated by components of the circuit(s). If a protective sensor is a transistor which has a very thin gate oxide as compared with the transistors in the circuits, this gate oxide is destroyed by the voltage because of the ion beam. This can easily be evaluated.

The protective sensors can either be distributed on the semiconductor chip so that they cover the surface, or else a small number of sensors is sufficient.

The particular advantage of the invention is that removing the protective layer and subsequently adding a bypass line—if the presence of the protective layer is checked—is unsuccessful, since the protective sensor has already detected removal of the protective layer in nonvolatile fashion, and the circuit therefore no longer works and can consequently be operated neither with nor without a protective layer. The important thing here is that the manipulation of the protective layer has been stored in a nonvolatile fashion, which can be achieved by a gate oxide being destroyed, for example.

In accordance with an additional feature of the invention, the protective sensor is in the form of a nonvolatile memory cell which is formed using drain and source diffusion regions produced on both sides of a channel region in the semiconductor substrate. The protective sensor also has a fully insulated gate electrode, at least part of which is arranged above the channel region, and two control gate electrodes which are arranged above the insulated gate electrode. One of the control gate electrodes forms the detection connection, and the other control gate electrode and also the diffusion regions are connected to an evaluation circuit.

In this novel nonvolatile memory cell, a voltage produced by an ion beam results in the charge on the insulated gate being changed. The charge is not able to drain. The second control gate connection and the connections of the diffusion regions can be used to read, and hence detect, the modified state of the memory cell at any time.

Advantageously, the insulated gate is given an initial charge, and, when there are a plurality of protective sensors, initial charges are applied using different polarities, which means that manipulation is reliably detected.

In accordance with a concomitant feature of the invention, at least one of the circuits on the substrate includes at least one detection circuit connected to the output connection of the protective sensor.

Other features which are considered as characteristic for the invention are set forth in the appended claims.

Although the invention is illustrated and described herein as embodied in a semiconductor chip with surface cover, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
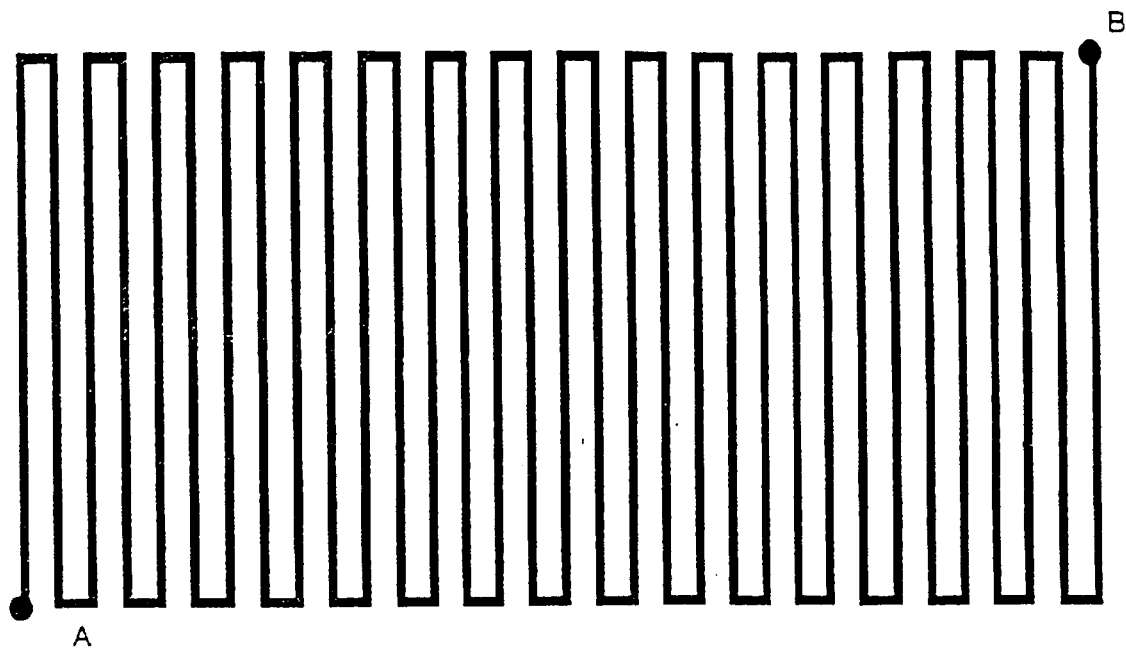
FIG. 1 shows one possible embodiment of a protective layer.

Referring now to the figures of the drawing in detail and first, particularly, to FIG. 1 thereof, there is shown a protective cover in the form of a meandering line with two connection points A, B, which are preferably produced in the topmost metal layer in a conventional fabrication process for semiconductor circuits. The connection points A, B are plated through to the circuit plane.

Figure 2:
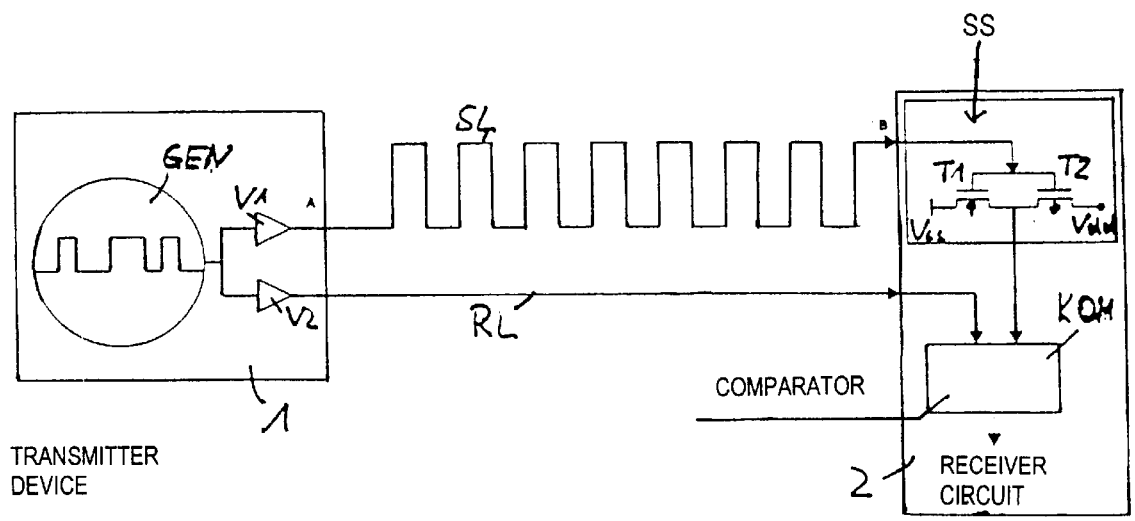
FIG. 2 shows the basic circuit diagram for one possible evaluation circuit having a protective sensor according to the invention.

There, they can be connected to a circuit as shown in FIG. 2. A signal generator GEN produced on the semiconductor chip in a transmitter device 1 generates a signal which, in the example shown, is supplied to a protective line SL (as shown in FIG. 1) and to a reference line RL via amplifiers V1, V2. The connection point B of the protective line is connected to the gate connections of two transistors T1, T2 which have a thin gate oxide layer and which are connected as CMOS inverters and act as a protective sensor SS. The output of the protective sensor SS is connected, as is the second connection of the reference line RL, to one of the inputs of a comparator KOM whose output signal indicates whether or not the protective sensor SS is intact. In this context, the protective sensor SS and the comparator KOM form a receiver circuit 2.

If the protective sensor SS is intact, its output delivers the same signal as the reference line RL. However, if the protective sensor has been destroyed on account of an excessive voltage resulting from an ion beam attack, its output delivers either a logic one or a logic zero constantly, which is detected by the comparator KOM. The output signal from the comparator KOM makes it impossible for the actual circuit produced on the semiconductor chip to operate properly any longer.

Figure 3:
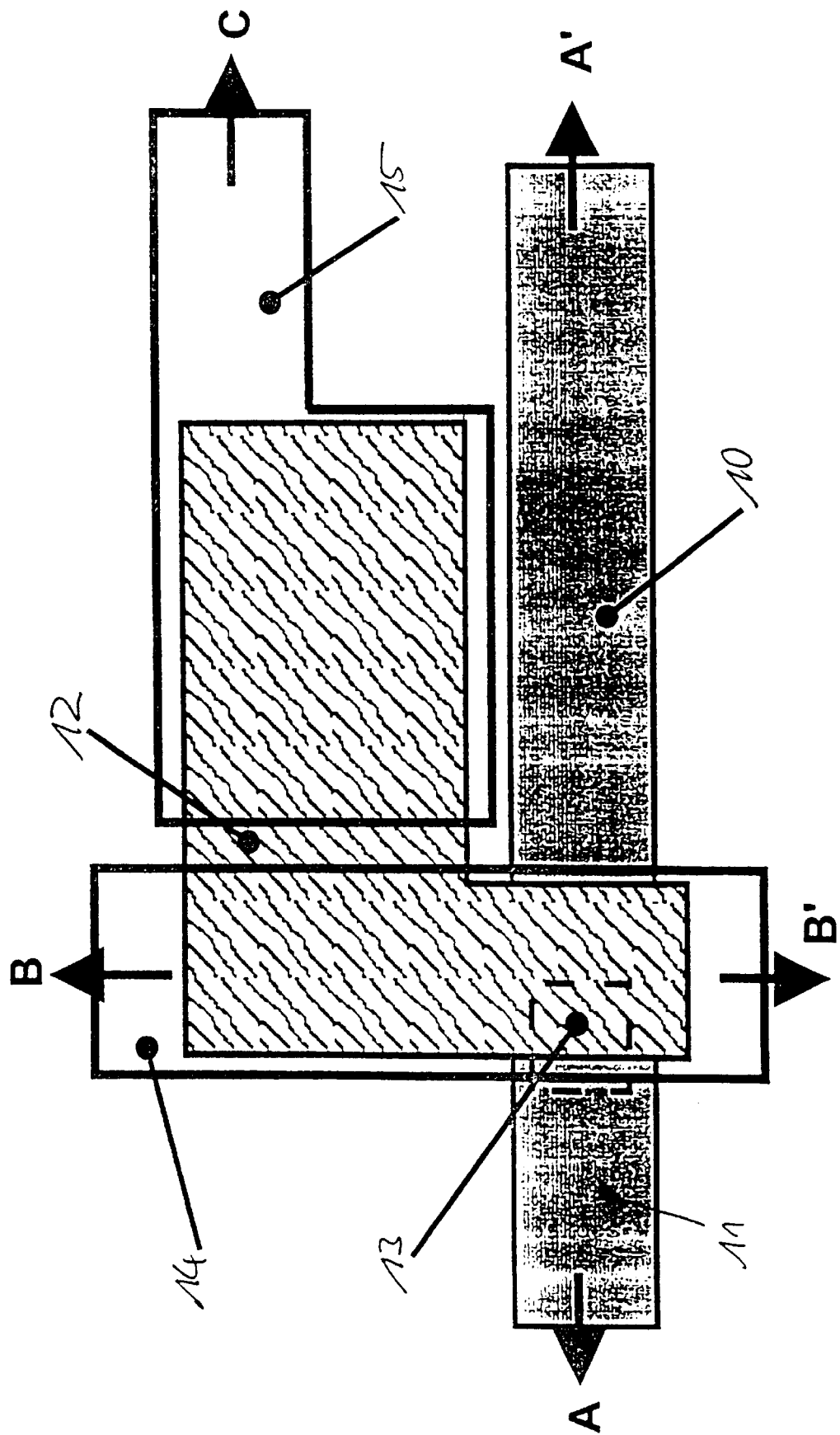
FIG. 3 shows a plan view of a protective sensor according to the invention in the form of a nonvolatile memory cell.

FIG. 3 shows a plan view of a basic illustration of a nonvolatile memory cell according to the invention, having two control gate electrodes 14, 15. Two diffusion regions 10, 11 acting as the drain and the source of a field effect transistor have a channel region (not denoted in any more detail) formed between them in a known manner, The channel region covers a subregion of an insulated gate electrode 12 a so-called floating gate The insulating layer between the channel region and the source or drain region 11, on the one hand, and the insulated gate electrode 12, on the other hand, is particularly thin in a small region and forms a tunnel window 13 there. A first control gate electrode 14 is arranged above a first region of the insulated gate electrode 12, and a second control gate electrode 15 is arranged above a second region The diffusion region 10, 11 and the control gate electrodes 14, is have connections A, A', B, B' and C.

Figure 4:
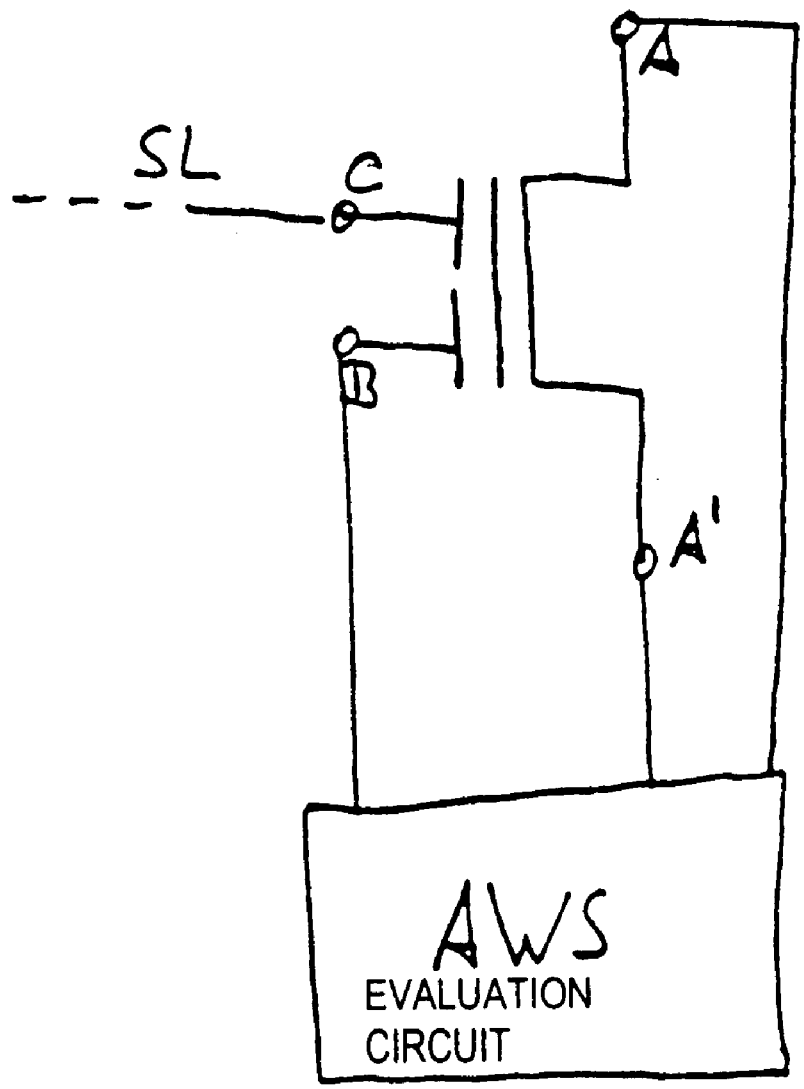
FIG. 4 shows a basic illustration of an evaluation circuit in conjunction with the nonvolatile memory cell.

The novel memory cell may advantageously be used instead of the transistors with a thin gate oxide as shown in FIG. 2. In this case, the connection C of the memory cell then needs to be connected to the connection B of the protective line SL. The connection B of the memory cell and the connections of the diffusion regions A, A' of the memory cell are firstly used for applying an initial charge to the insulated gate electrode and are secondly connected to an evaluation circuit AWS for the purpose of evaluating the charge state of the insulated gate electrode. This configuration is shown in FIG. 4.

In one advantageous development of the invention, the initial charge is applied to the insulated gate electrode before the semiconductor chip is delivered, by applying a high programming voltage of, for example, 16 V between one of the connections B or B' of the first control gate electrode 14 and the connection A of the diffusion region 11 during the test phase. This charge establishes a particular threshold voltage for the memory transistor. The threshold voltage is thus a measure of the charge on the insulated gate electrode. If an FIB attack is now made, a voltage builds up between the second control gate electrode 15 and the channel region. This voltage results in a tunnel current through the tunnel window 13, and hence in a change in the charge on the insulated gate electrode 12. This change in the charge can be detected by the evaluation circuit AWS by determining the threshold voltage by applying a changing read voltage to the first control gate electrode 14. A threshold voltage which has changed means that the charge on the insulated gate electrode has been modified.

If an FIB attack has been recorded in nonvolatile fashion in this way, suitable defense mechanisms can be activated when the semiconductor chip is next put into use.

As initial charge, both positive and negative charges can be applied to the insulated gate electrode 12, and in the case of different protective sensors, charges of varying number and polarity may also be applied, in order to increase the reliability of detecting an FIB attack.

The particular advantage of the invention's use of a protective layer in conjunction with a protective sensor is that the protective sensor stores an indication of an ion beam examination of the protective layer in nonvolatile fashion. Hence even subsequent repair of the protective layer or appropriate bypass lines cannot cause the semiconductor chip to work properly again.

We claim:

1. A semiconductor chip having a protective sensor for prohibiting proper circuit operation if a protective layer has been tampered with, the semiconductor chip comprising:

a semiconductor substrate having at least one layer and having a plurality of circuits configured in at least one group, said plurality of said circuits disposed in said at least one layer;

at least one conductive protective layer configured above said at least one group and electrically connected to at least one of said plurality of circuits;

at least one protective sensor formed for storing a state in a nonvolatile manner, said protective sensor having a detection connection connected to said at least one conductive protective layer, said protective sensor having an output connection connected to at least one of said plurality of said circuits such that said at least one of said plurality of said circuits cannot operate properly if the stored state is a defined, nonvolatile level and is provided at said output of said at least one protective sensor.

2. The semiconductor chip according to claim 1, wherein: said plurality of said circuits includes a plurality of transistors having gate oxides; and said at least one protective sensor includes at least one transistor having a very thin gate oxide as compared with said gate oxides of said plurality of transistors of said plurality of said circuits, said at least one transistor of said at least one protective sensor having a gate connection connected to said at least one conductive protective layer.

3. The semiconductor chip according to claim 1, comprising an evaluation circuit, and wherein:

said at least one protective sensor is a nonvolatile memory cell including a channel region having a first side and a second side and is disposed in said semiconductor substrate;

said memory cell includes a source diffusion region disposed on said first side and a drain diffusion region disposed on said second side;

said memory cell includes a fully insulated gate electrode having at least portion disposed above said channel region;

said memory cell includes two control gate electrodes disposed above said insulated gate electrode, one of said two control gate electrodes forming said detection connection; and another one of said two control gate electrodes, said source diffusion region, and said drain diffusion region are connected to said evaluation circuit.

4. The semiconductor chip according to claim 3, wherein said insulated gate electrode has an initial charge selected from the group consisting of a positive charge and a negative charge.

5. The semiconductor chip according to claim 4, wherein said at least one protective sensor includes a plurality of protective sensors having insulated gate electrodes, some of said insulated gate electrodes of said plurality of said sensors having initial positive charges, others of said insulated gate electrodes of said plurality of said sensors having initial negative charges.

6. The semiconductor chip according to claim 1, wherein at least one of said plurality of said circuits includes at least one detection circuit connected to said output connection of said at least one protective sensor.

* * * * *